(12) United States Patent
Mai

(10) Patent No.: US 9,838,011 B2
(45) Date of Patent: Dec. 5, 2017

(54) INTEGRATED CIRCUIT CHIP AND ITS IMPEDANCE CALIBRATION METHOD

(71) Applicant: CAPITAL MICROELECTRONICS CO., LTD., Beijing (CN)

(72) Inventor: Rifeng Mai, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 133 days.

(21) Appl. No.: 14/405,881

(22) PCT Filed: Apr. 1, 2014

(86) PCT No.: PCT/CN2014/074551
§ 371 (c)(1),
(2) Date: Dec. 5, 2014

(87) PCT Pub. No.: WO2015/149283
PCT Pub. Date: Oct. 8, 2015

(65) Prior Publication Data
US 2016/0277026 A1   Sep. 22, 2016

(51) Int. Cl.
*H03K 17/16* (2006.01)
*H03K 19/00* (2006.01)
(Continued)

(52) U.S. Cl.
CPC ....... *H03K 19/0005* (2013.01); *G11C 29/025* (2013.01); *G11C 29/026* (2013.01); *G11C 29/028* (2013.01); *G11C 29/50008* (2013.01); *H03K 17/6872* (2013.01); *G11C 7/1057* (2013.01); *G11C 2207/2254* (2013.01)

(58) Field of Classification Search
CPC ............. H03K 19/0005; H03K 19/003; H03K 19/00315; H03K 19/00346; H03K 19/00361; H03K 19/00369; H03K 17/6872
USPC ........... 326/30, 82–83, 86–87; 327/108–109, 327/112
See application file for complete search history.

(56) References Cited

U.S. PATENT DOCUMENTS 7,230,448 B2 * 6/2007 Choe ................... H04L 25/0278
326/28
7,417,452 B1 * 8/2008 Wang ................... H03K 17/005
326/30
(Continued)

FOREIGN PATENT DOCUMENTS

CN   1101127235   2/2008
CN   101145776    3/2008
(Continued)

OTHER PUBLICATIONS

International Search Report issued in corresponding International Application No. PCT/CN2014/074551, dated Nov. 28, 2014; with English Translation (4 pages).

*Primary Examiner* — Jason M Crawford
(74) *Attorney, Agent, or Firm* — Buchanan Ingersoll & Rooney PC

(57) ABSTRACT

An integrated circuit chip includes at least one driver circuit of single-ended structure and the first drive circuit, the first drive circuit and the at least one driver circuit of single-ended structure have the same structure, the first drive circuit includes a plurality of parallel-connected PMOS tubes and a plurality of parallel-connected NMOS tubes, the plurality of parallel-connected PMOS tubes connect the plurality of parallel-connected NMOS tube in series at a first node. After impedance calibration has been conducted, the chip confines a first impedance calibration code and a second impedance calibration code, and controls the at least one driver according to the first impedance calibration code and the second impedance calibration code; the first reference voltage is preferably configured to ¾ times of the supply voltage $V_{DD}$, and the second reference voltage is preferably configured to ¼ times of the supply voltage $V_{DD}$.

4 Claims, 7 Drawing Sheets

(51) Int. Cl.
*G11C 29/02* (2006.01)
*G11C 29/50* (2006.01)
*H03K 17/687* (2006.01)
*G11C 7/10* (2006.01)

(56) References Cited

U.S. PATENT DOCUMENTS

| | | | | |
|---|---|---|---|---|
| 7,535,250 | B2* | 5/2009 | Batt | H03K 19/0005 |
| | | | | 326/30 |
| 7,782,078 | B2* | 8/2010 | Koo | G11O 5/063 |
| | | | | 326/30 |
| 7,804,323 | B2* | 9/2010 | Kim | H03K 19/0005 |
| | | | | 326/26 |
| 7,808,278 | B2* | 10/2010 | Nguyen | H03F 3/19 |
| | | | | 326/30 |
| 7,952,382 | B2* | 5/2011 | Moon | G11O 5/063 |
| | | | | 326/30 |
| 8,446,173 | B1* | 5/2013 | Faucher | H03K 19/00361 |
| | | | | 326/27 |
| 9,018,973 | B2* | 4/2015 | Kaiwa | H04L 25/0278 |
| | | | | 324/601 |
| 2003/0193350 | A1* | 10/2003 | Chow | H03K 19/018585 |
| | | | | 326/83 |
| 2004/0008054 | A1* | 1/2004 | Lesea | H04L 25/0278 |
| | | | | 326/30 |
| 2011/0128038 | A1 | 6/2011 | Ko | |

FOREIGN PATENT DOCUMENTS

| CN | 101256826 | 9/2008 |
|---|---|---|
| CN | 101789780 | 7/2010 |

\* cited by examiner

INTEGRATED CIRCUIT CHIP AND ITS IMPEDANCE CALIBRATION METHOD

BACKGROUND

Technical Field

The present invention relates to integrated circuit, and more particularly to an integrated circuit chip and its impedance calibration method.

Related Art

In designing an integrated circuit chip, the output impedance of the chip is required to be in match with specific impedance such as that of receiving circuit or transmission line of cable so as to correctly transmit signals by preventing reflection of output signal and loss thereof. In addition, rise time and fall time (slew time) of waveform of the output signal shall be adjusted to fall into appropriate range. If it is too short, noise may be generated. If it is too long, the waveform may be deteriorated.

In order to solve the above problems, functions for adjusting and controlling terminating resistance of an interface circuit have been provided within some prior art internal integrated circuit chips. For example, as far as an ODT (on-die termination) circuit configured for DDR2 standard memory is concerned, it has terminal resistance value that can be adjusted to 75 ohms or 150 ohms. In other words, multiple PMOS tubes and NMOS tubes are connected in parallel in the ODT circuit, thus forming the terminal resistance. In fact, the number of the transistors connected in parallel is adjusted by supplying control signal(s) to gates of the transistors so that the value of the transistor resistance in sum is controlled to be equal to the resistance value of external standard resistance.

FIG. 1 shows a structural schematic view of an impedance calibration circuit in the integrated circuit chip of the prior art. As shown in FIG. 1, when the circuit is conducted impedance calibration, a standard impedance Rref is connected to node A, a comparator 710 compares the voltage value of node A with that of the reference voltage configured to ½ or ⅓ times of supply voltage, and outputs the comparison signal; a control module that is not shown in FIG. 1 outputs an impedance calibration code P-CODE[0 . . . N] according to the comparison signal, so as to turn the multiple parallel PMOS tubes on and off, respectively. When the value of node A is equal to that of the reference voltage, the control module keep outputting the current calibration code P-CODE[0 . . . N], the calibration code P-CODE[0 . . . N] being used as reference calibration code for other interface driver circuit.

The foregoing prior art integrated circuit chips have the following defects: on one hand, it cannot be adapted simultaneously to both single-ended signal output and differential signal output; On the other hand, the configuration of the reference voltage cannot be suitable for wide range of power supply voltage. As shown in FIG. 2, when the supply voltage is in the range of 1.8V~3.3V, the reference voltage is configured to ½ or ⅓ times of supply voltage according to the impedance calibration circuit of the prior art, resulting in a narrow linear range of output characteristic curve.

SUMMARY

An objective of the present invention is to provide an integrated circuit chip and its impedance calibration method of eliminating the foregoing defects of the prior art.

In order to implement the foregoing purpose, at a first aspect, the present invention provides an integrated circuit chip, comprising at least one driver circuit of single-ended structure and a first drive circuit, wherein the first drive circuit and the at least one driver circuit of single-ended structure have the same structure, the first drive circuit comprises a plurality of parallel-connected PMOS tubes and a plurality of parallel-connected NMOS tubes, the plurality of parallel-connected PMOS tubes connect with the plurality of parallel-connected NMOS tubes in series at a first node, the first node provides single-ended signal output; and the chip further comprises a comparator, a code processing module and a control module; when the chip is conducted impedance calibration, a standard impedance is connected to the first node, the plurality of parallel-connected NMOS tubes are turned off, the comparator compares the value of the first node with that of a first reference voltage, and outputs a first comparison signal, the code processing module outputs a first impedance calibration code according to the first comparison signal, so as to turn the plurality of parallel-connected PMOS tubes on and off, respectively; then the plurality of parallel-connected NMOS tubes are turned on, the comparator compares the current value of the first node with the value of the second reference voltage, and outputs a second comparison signal, the code processing module outputs a second impedance calibration code according to the second comparison signal, so as to turn the plurality of parallel-connected NMOS tubes on and off, respectively; the code processing module controls the at least one driver circuit of single-ended structure according to the first impedance calibration code and the second impedance calibration code.

At a second aspect, the present invention further provides an integrated circuit chip, comprising at least one driver circuit of differential structure and a first drive circuit, wherein the first drive circuit and the at least one driver circuit of differential structure have the same structure, the first drive circuit comprises parallel-connected PMOS tubes of a first group, parallel-connected NMOS tubes of a second group, parallel-connected PMOS tubes of a third group, parallel-connected NMOS tubes of a fourth group and parallel-connected MOS tubes of a fifth group, wherein the parallel-connected PMOS tubes of the first group and the parallel-connected PMOS tubes of the third group have the same structure, the parallel-connected NMOS tubes of the second group and the parallel-connected NMOS tubes of the fourth group have the same structure, the parallel-connected PMOS tubes of the first group and the parallel-connected NMOS tubes of the second group are connected in series at a first node, the parallel-connected PMOS tubes of the third group and the parallel-connected NMOS tubes of the fourth group are connected in series at a second node, the first node and the second node are connected by the parallel-connected MOS tubes of the fifth group, the first node and the second node provide a differential signal output; the chip further comprises a first comparator, a second comparator, a first code processing module, a second code processing module and a third code processing module; when the chip is conducted impedance calibration, the parallel-connected NMOS tubes of the second group, the parallel-connected PMOS tubes of the third group, the parallel-connected NMOS tubes of the fourth group and the parallel-connected MOS tubes of the fifth group are turned off, a standard impedance is connected to the first node, the parallel-connected PMOS tubes of the first group are turned on, the first comparator compares the value of the first node with that of the first reference voltage, and outputs the first comparison signal, the first code processing module outputs a first impedance calibration code according to the first comparison signal, so as to turn the plurality of parallel-connected PMOS tubes of the first group on and off, respectively; and with the parallel-connected PMOS tubes of the first group remaining turned on and off, respectively, the parallel-connected NMOS tubes of the second group are turned on, the first comparator compares the current value of the first node with the value of the second reference voltage and outputs a second comparison signal, the second code processing module outputs a second impedance calibration code according to the second comparison signal, so as to turn the plurality of parallel-connected NMOS tubes of the second group on and off, respectively; the parallel-connected PMOS tube of the third group are turned on and off, respectively, by copying the impedance calibration code of the parallel-connected PMOS tubes of the first group, the parallel-connected NMOS tubes of the fourth group are turned on and off, respectively, by copying the impedance calibration code of the parallel-connected NMOS tube of the second group; with the parallel-connected PMOS tubes of the first group remaining turned on and off, respectively, and parallel-connected NMOS of the fourth group turned on and off, respectively, and with the parallel-connected NMOS tubes of the second group, the parallel-connected PMOS tubes of the third group turned off, the second comparator compares the current value of the second node with the value of a third reference voltage and outputs a third comparison signal, the third code processing module outputs a third impedance calibration code according to the third comparison signal, so as to turn the plurality of parallel-connected MOS tubes of the fifth group on and off, respectively; the third code processing module is used to output the third impedance calibration code, so as to turn the parallel-connected MOS tubes of the fifth group on and off, respectively, the chip controls the at least one driver circuit of differential structure according to the first impedance calibration code, the second impedance calibration code, and the third impedance calibration code.

At a third aspect, the present invention provides an impedance calibration method of integrated circuit chip, wherein the integrated circuit chip comprises at least one driver circuit of single-ended structure and a first drive circuit, the first drive circuit and the at least one driver circuit of single-ended structure have the same structure, the first drive circuit comprises a plurality of parallel-connected PMOS tubes and a plurality of parallel-connected NMOS tubes, said method comprises the following steps: When conducting impedance calibration, the standard impedance is connected to a first node, the first node provides a single-ended signal output, the plurality of parallel-connected NMOS tubes are turned off, the comparator compares the voltage value of the first node with that of the first reference voltage, outputs the first comparison signal, and a first impedance calibration code is output according to the first comparison signal, so as to turn the plurality of parallel-connected PMOS tube on and off, respectively; Keep status of the plurality of parallel-connected PMOS tubes remain unchanged, turn the plurality of parallel-connected NMOS tubes on, compare the current value of the first node with the value of the second reference voltage, output the second comparison signal, and a second impedance calibration code is output according to the second comparison signal, so as to turn the plurality of parallel-connected NMOS tubes of the second group on and off, respectively; According to the first impedance calibration code and the second impedance calibration code that have been calibrated, the at least one driver circuit of single-ended structure in the chip is controlled.

At a fourth aspect, the present invention further provides a method of impedance calibrating an integrated circuit chip, wherein the integrated circuit chip comprises at least one driver circuit of differential structure and a first drive circuit, the first drive circuit and the at least one driver circuit of differential structure have the same structure, the first drive circuit comprises parallel-connected PMOS tubes of a first group, parallel-connected NMOS tubes of a second group, parallel-connected PMOS tubes of a third group, parallel-connected NMOS tubes of a fourth group and parallel-connected MOS tubes of a fifth group, the parallel-connected PMOS tubes of the first group and the parallel-connected PMOS tube of the third group have the same structure, the parallel-connected NMOS tube of the second group and the parallel-connected NMOS tube of the fourth group have the same structure, said method comprises steps of: When conducting impedance calibration, the parallel-connected NMOS tubes of the second group, the parallel-connected PMOS tubes of the third group, the parallel-connected NMOS tubes of the fourth group and the parallel-connected MOS tubes of the fifth group are turned off at first, a standard impedance is connected to the first node, the parallel-connected PMOS tubes of the first group are turned on, the value of the first node is compared with that of the first reference voltage, and a first comparison signal is output, a first impedance calibration code is output according to the first comparison signal, so as to turn the parallel-connected PMOS tubes of the first group on and off, respectively; Then, with the parallel-connected PMOS tubes of the first group remaining turned on and off, respectively, the parallel-connected PMOS tube of the second group are turned on, the second comparator compares the value of the second node with that of the second reference voltage, and outputs a second comparison signal, a second impedance calibration code is output according to the second comparison signal, so as to turn the parallel-connected PMOS tube of the fourth group on and off, respectively; the parallel-connected PMOS tubes of the third group are turned on and off, respectively, by copying the impedance calibration code of the parallel-connected PMOS tubes of the first group, the parallel-connected NMOS tubes of the fourth group are turned on and off, respectively, by copying the impedance calibration code of the parallel-connected NMOS tube of the second group; with the parallel-connected PMOS tubes of the first group remaining turned on and off, respectively, and parallel-connected NMOS of the fourth group turned on and off, respectively, and with the parallel-connected NMOS tubes of the second group, the parallel-connected PMOS tubes of the third group turned off, the current value of the second node is compared with the value of a third reference voltage and a third comparison signal is output, a third impedance calibration code is output according to the third comparison signal, so as to turn the plurality of parallel-connected MOS tubes of the fifth group on and off, respectively; the at least one driver circuit of differential structure is controlled according to the first impedance calibration code that have been calibrated, the second impedance calibration code and the third impedance calibration code that have been calibrated.

The present invention has a simple structure, it can be adapted to the single-ended signal output and differential signal output at the same time, and can be adapted to wide range of power supply voltage.

DETAILED DESCRIPTION

The other features, characteristics and advantages of the present invention will be more obvious after the present invention is described below in detail with reference to the accompanying drawings by the way of example.

Figure 1:
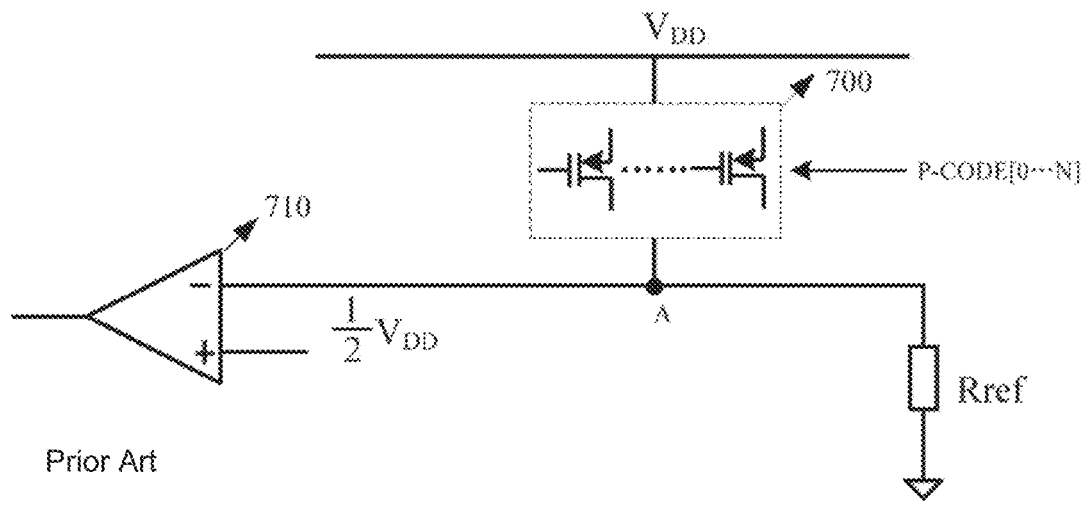
FIG. 1 is a schematic view of an integrated circuit chip of the prior art.
Figure 2:
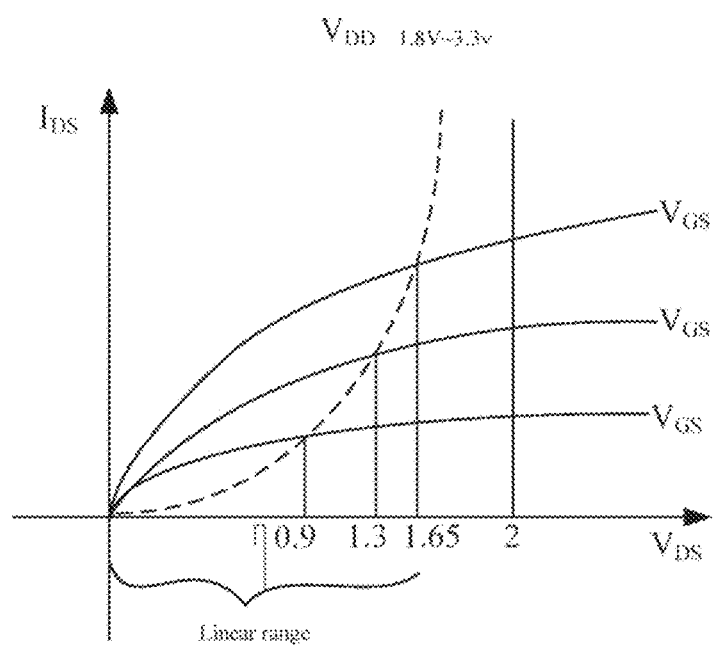
FIG. 2 shows a linear range of output characteristic curve.
Figure 3:
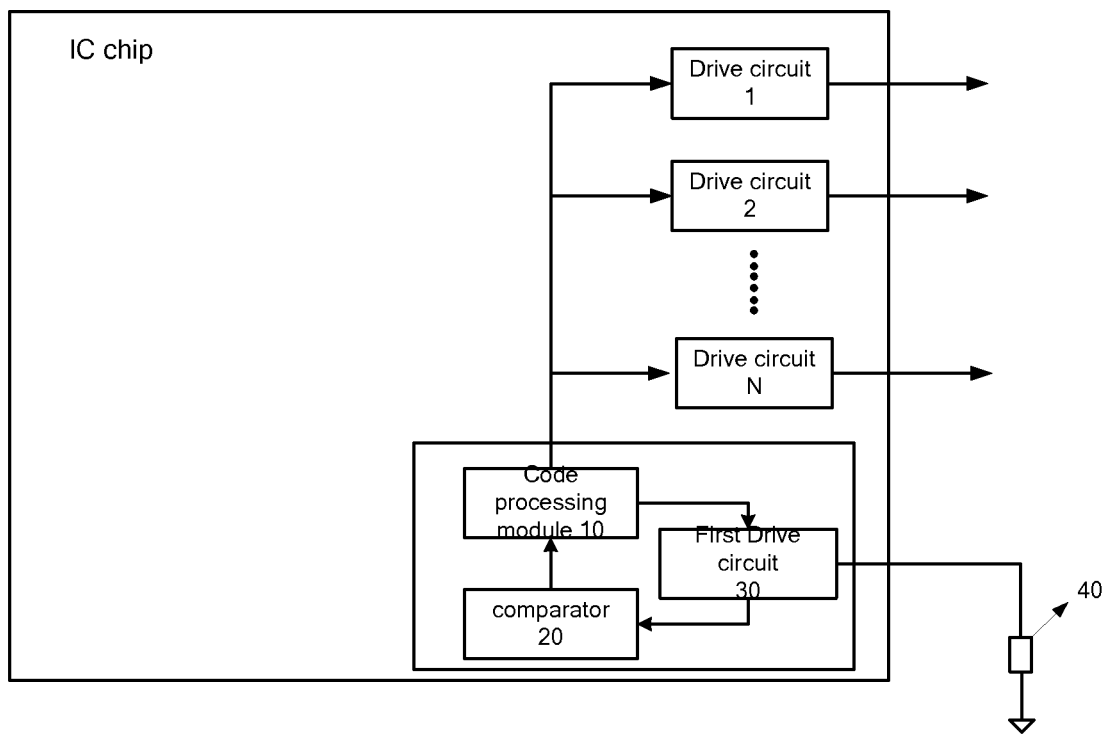
FIG. 3 is a schematic view of an integrated circuit chip according to an embodiment of the present invention.

FIG. 3 is a schematic view of an integrated circuit chip according to an embodiment of the present invention. As shown in FIG. 3, the integrated circuit chip comprises a drive circuit 1 . . . N, a code processing module 10, a comparator 20 and a first drive circuit 30. Among them, the drive circuit 1 . . . N can be a be a driver circuit of single-ended structure, and can also be a driver circuit of differential structure; the first drive circuit 30 and the drive circuit 1 . . . N have the same structure. The comparator 20 is used to compare voltage value of node in the first drive circuit 30 with that of the reference voltage, the code processing module 10 outputs the impedance calibration code to the first drive circuit 30 according to comparison results of the comparator 20. After the first drive circuit 30 finishes the impedance calibration, the code processing module 10 sends the impedance calibration code which has gone through calibration to the drive circuit 1 . . . N.

Figure 4:
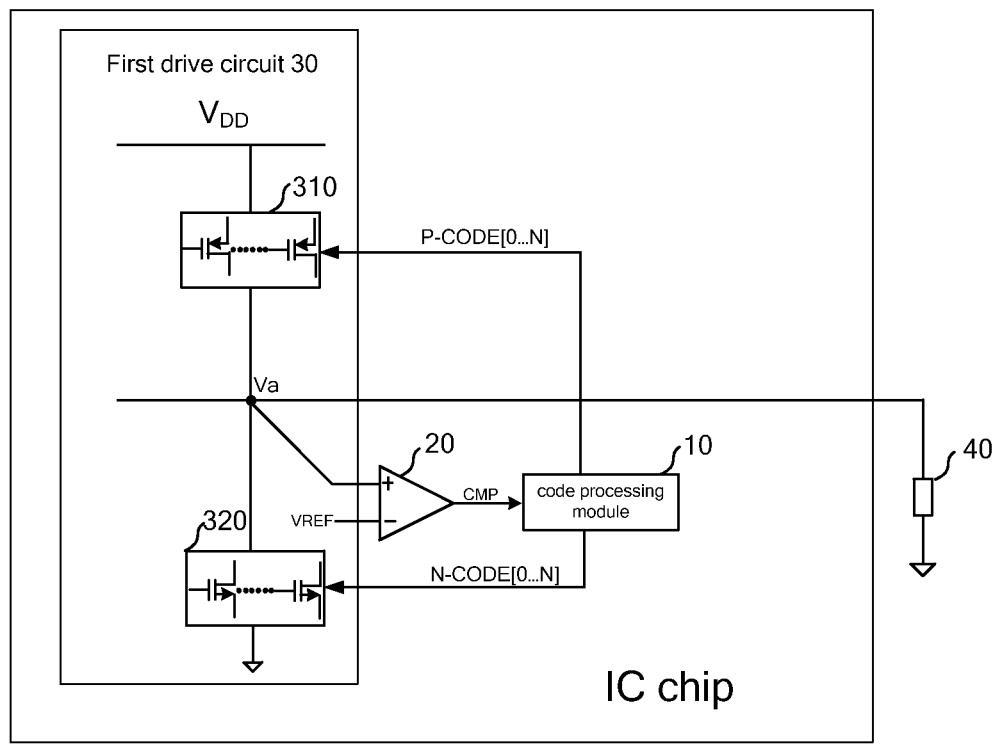
FIG. 4 is a schematic view of an integrated circuit chip with a single-ended structure according to an embodiment of the present invention.

FIG. 4 is a schematic view of an integrated circuit chip with a single-ended structure according to an embodiment of the present invention. As shown in FIG. 4, the integrated circuit chip comprises a comparator 20, a code processing module 10, at least a driver circuit of single-ended structure (not shown in the figure), and a first drive circuit 30, wherein the first drive circuit 30 and the driver circuit of single-ended structure have the same structure. Specifically, the first drive circuit 30 comprises a plurality of parallel-connected PMOS tubes 310 and a plurality of parallel-connected NMOS tubes 320, the plurality of parallel-connected PMOS tubes 310 and the plurality of parallel-connected NMOS tubes 320 are connected in series at a first node Va, which provides single-ended signal output.

When conducting impedance calibration, the standard impedance 40 is connected to the first node Va, the plurality of parallel-connected NMOS tubes 320 are turned off; the comparator 20 compares the voltage value of the first node Va with that of the first reference voltage, and outputs a first comparison signal, wherein, preferably, the first reference voltage is configured to ¾ times of the supply voltage $V_{DD}$. The code processing module 10 outputs a first impedance calibration code P-CODE[0 . . . N] according to the first comparison signal, so as to turn the a plurality of parallel-connected PMOS tubes 310 on and/or off, respectively.

Then, with the status (turn on or off) of the plurality of parallel-connected PMOS tubes 310 remaining unchanged, the plurality of parallel-connected NMOS tubes 320 are turned on, the comparator 20 compares the current voltage value of the first node Va with the value of the second reference voltage, and outputs a second comparison signal. Preferably, the second reference voltage is configured to ¼ times of the supply voltage $V_{DD}$. The code processing module 10 outputs a second impedance calibration code N-CODE[0 . . . N] to the plurality of parallel-connected NMOS tubes 320 according to the second comparison signal, so as to turn the plurality of parallel-connected NMOS tubes 320 on and/or off, respectively. After the first drive circuit 30 finishes the impedance calibration, the integrated circuit chip controls the at least one driver circuit of single-ended structure according to the first impedance calibration code P-CODE[0 . . . N] and the second impedance calibration code N-CODE[0 . . . N].

Figure 4A:
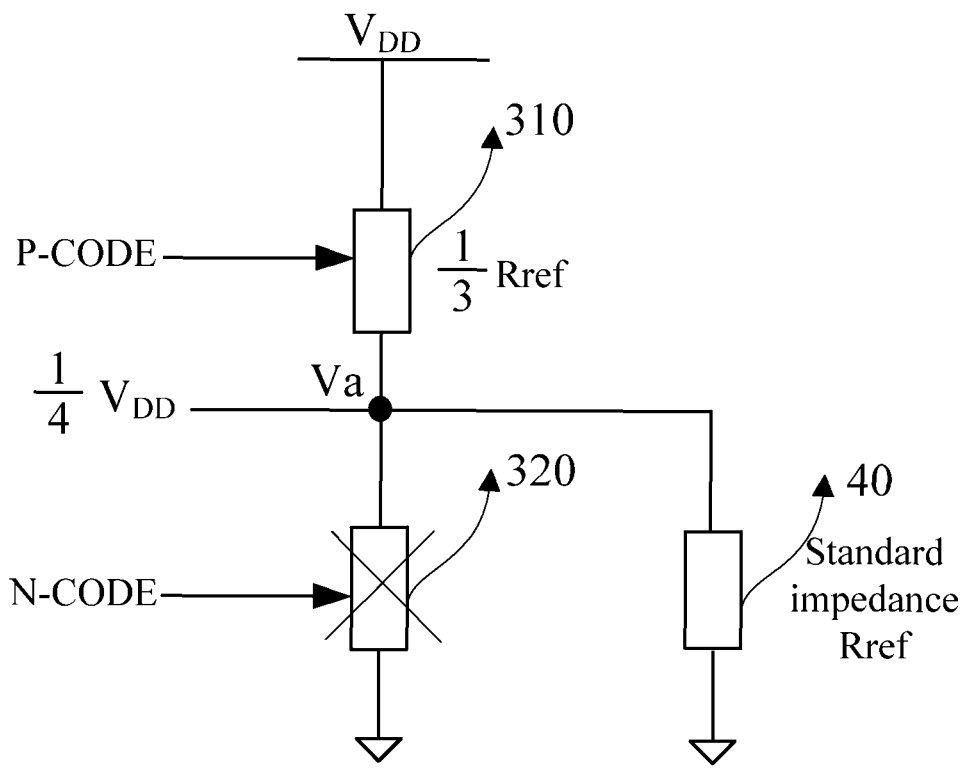
FIG. 4A is a schematic view of equivalent circuit of impedance calibrated drive circuit of single-ended structure in FIG. 4.

In the embodiment of conducting impedance calibration to the plurality of parallel-connected PMOS tube 310, as shown in FIG. 4A, the voltage of the first node Va is configured to ¼ times of the supply voltage. When the integrated circuit chip is conducted impedance calibration, firstly, the standard impedance 40 (Rref) is connected to the first node Va, the code processing module 10 (not shown in figure) outputs the impedance calibration code N-CODE to the plurality of parallel-connected NMOS tube 320, so as to turn off all of the NMOS tubes in the plurality of parallel-connected NMOS tubes 320; and then outputs the initial impedance calibration code to the plurality of parallel-connected PMOS tubes 310, so as to turn on corresponding PMOS tubes in the plurality of parallel-connected PMOS tubes 310; the impedance of the plurality of parallel-connected PMOS tubes 310 may be set to be ⅓ Rref after the impedance calibration.

Figure 4B:
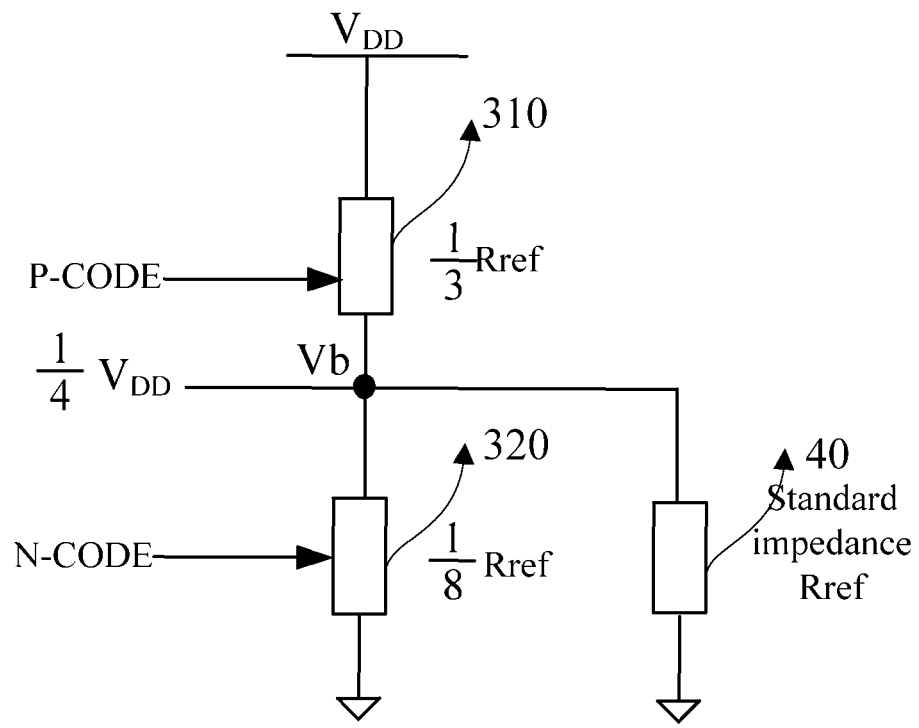
FIG. 4B is a schematic view of equivalent circuit of impedance calibrated drive circuit of single-ended structure in FIG. 4.

After the plurality of parallel-connected PMOS tubes 310 have been conducted impedance calibration, the plurality of parallel-connected NMOS tubes 320 starts to be subject to impedance calibration. As shown in FIG. 4B, in the case of keeping the statuses of the plurality of parallel-connected PMOS tubes 310 unchanged (that is, the calibrated impedance of the plurality of parallel-connected PMOS tubes 310 is ⅓ Rref), the plurality of parallel-connected NMOS tubes 320 are turned on, with the voltage of the second node Vb configured to ¼ times of the supply voltage. Finally, after the impedance calibration, the impedance of the plurality of parallel-connected NMOS tubes 320 is set to be ⅛ Rref.

Figure 4C:
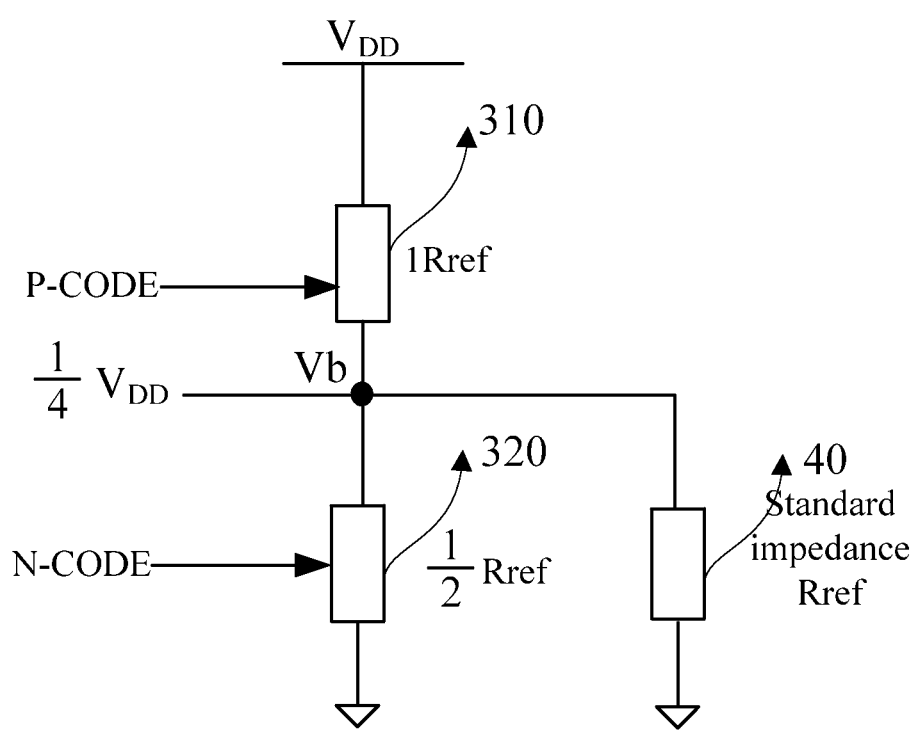
FIG. 4C is a schematic view of equivalent circuit of impedance calibrated drive circuit of single-ended structure in FIG. 4.

Preferably, when conducting impedance calibration to the plurality of parallel-connected NMOS tubes 320, a different number of parallel-connected PMOS tube 310 may be chosen, for example, three times of the calibrated impedance of the plurality of parallel-connected PMOS tube 310 (⅓ Rref*3=1Rref) before conducting the impedance calibration of the a plurality of parallel-connected NMOS tube 320. The calibrated impedance of the plurality of parallel-connected NMOS tube 320 is ½ Rref, as shown in FIG. 4C.

Figure 5:
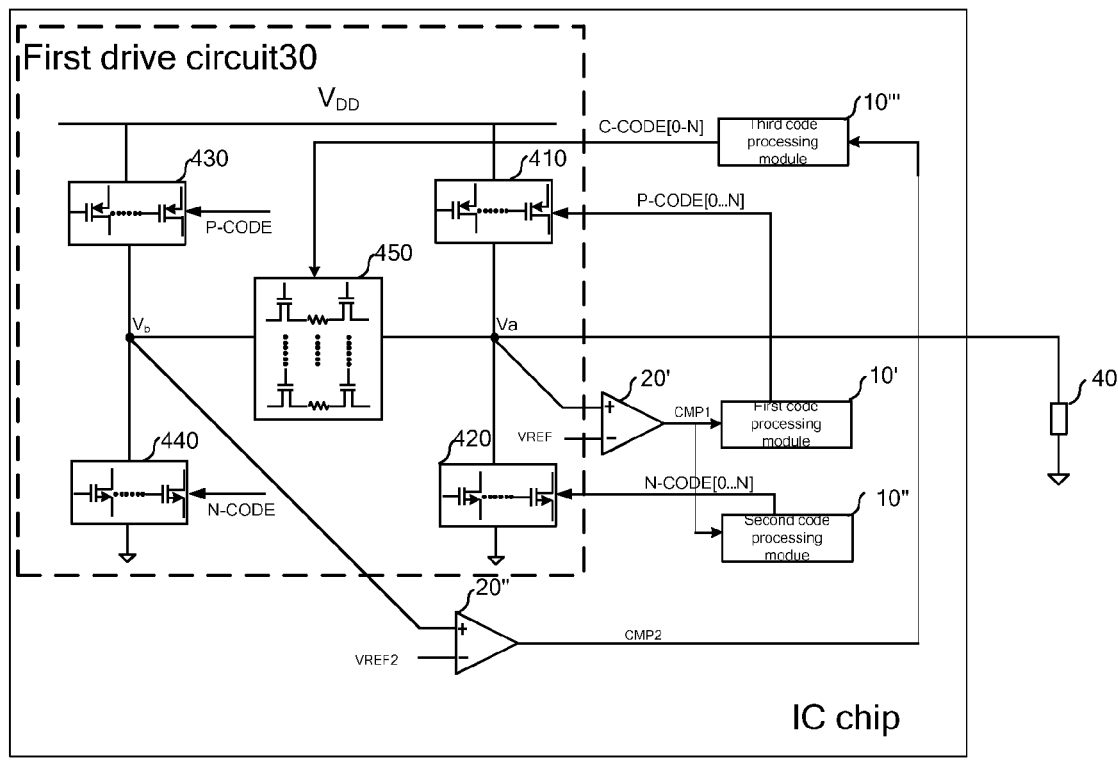
FIG. 5 is a schematic view of an integrated circuit chip with a differential structure according to an embodiment of the present invention.

FIG. 5 is a schematic view of an integrated circuit chip with differential structure according to an embodiment of the present invention. As shown in FIG. 5, the integrated circuit chip comprises at least one driver circuit of differential structure (not shown in the figure), a first drive circuit 30, a first comparator 20', a second comparator 20", a first code processing module 10', a second code processing module 10" and a third code processing module 10'''. Wherein, the first drive circuit 30 comprises a first group of parallel-connected PMOS tubes 410, a second group of parallel-connected NMOS tubes 420, a third group of parallel-connected PMOS tubes 430, a fourth group of parallel-connected NMOS tubes 440 and a fifth group of parallel-connected MOS tubes 450. Wherein, the first group of parallel PMOS tubes 410 and the third group of parallel PMOS tubes 430 have the same structure, the second group of parallel NMOS tubes 420 and the fourth group of parallel-connected NMOS tubes 440 have the same structure, the parallel-connected PMOS tubes 410 of the first group and the parallel-connected NMOS tubes 420 of the second group are connected in series via a first node Va, the parallel PMOS tubes 430 of the third group and the parallel NMOS tubes 440 of the fourth group are connected in series via a second node Vb, the first node Va and the second node Vb are connected via the parallel-connected MOS tubes 450 of the fifth group, and the first node Va and the second node Vb provide differential signal output.

In an embodiment of impedance calibration, when the integrated circuit chip is conducted impedance calibration, firstly, the parallel-connected PMOS tubes 410 of the first group are conducted impedance calibration, the parallel-connected NMOS tubes 420 of the second group, the parallel-connected PMOS tubes 430 of the third group, the parallel-connected NMOS tubes 440 of the fourth group and the parallel-connected MOS tubes 450 of the fifth group are all turned off, the parallel-connected PMOS tubes 410 of the first group are turned on, a standard impedance 40 is connected to the first node Va, the first code processing module 10' outputs a initial impedance calibration code P-CODE[0 . . . N] to the plurality of parallel-connected PMOS tubes 410, so as to turn on corresponding PMOS tubes in the plurality of parallel-connected PMOS tubes 410. The first comparator 20' compares the voltage of the first node Va with that of the first reference voltage, and outputs the first comparison signal CMP1, wherein, the first reference voltage is configured to ¾ times of the supply voltage $V_{DD}$; the second reference voltage is configured to ¼ times of the supply voltage $V_{DD}$. If the voltage of the first node Va is less than the first reference voltage, the first code processing module 10' will raise the impedance calibration code P-CODE[0 . . . N], otherwise it will reduce the impedance calibration code P-CODE[0 . . . N] until the voltage of the first node Va is equal to the first reference voltage, so that the impedance of the parallel PMOS tube 410 of the first group is defined.

Then, the parallel NMOS tubes 420 of the second group are conducted impedance calibration, with the impedance calibration code of the plurality of parallel-connected PMOS tubes 410 of the first group keep unchanged. The parallel-connected NMOS tubes 420 of the second group are then turned on, The first comparator 20' compares the voltage of the first node Va with that of the first reference voltage, and outputs a second comparison signal; the second code processing module 10" outputs a second impedance calibration code N-CODE[0 . . . N] according to the second comparison signal, so as to turn the parallel NMOS tubes 420 of the second group on and/or off, respectively. When the voltage of the first node Va is less than the second reference voltage, the second code processing module 10" will reduce the impedance calibration code N-CODE[0 . . . N], otherwise it will raise the impedance calibration code N-CODE[0 . . . N] until the voltage of the second node Vb is equal to the second reference voltage, so that the impedance of the parallel NMOS tube 420 of the second group is confined.

The parallel-connected PMOS tubes 430 of the third group copy the impedance calibration code of the parallel PMOS tubes 410 of the first group, the parallel-connected NMOS tubes 440 of the fourth group copy the impedance calibration code of the parallel NMOS tubes 420 of the second group, so as to respectively control the turn-on/off of the parallel-connected PMOS tubes 430 of the third group and the parallel-connected NMOS tubes 440 of the fourth group. The second comparator 20" compares the voltage of the second node Vb with that of a second reference voltage, and outputs a third comparison signal. The third code processing module 10''' outputs the third impedance calibration code C-CODE[0 . . . N] based on the third comparison signal, so as to control the turn-on/off of the parallel MOS tube 450 of the fifth group. Similarly, impedance calibration code C-CODE[0 . . . N] will be adjusted based on the voltage of the second node Vb.

Thus, the integrated circuit chip controls at least one drive circuit of differential structure according to the first calibrated impedance calibration code P-CODE[0 . . . N], the second calibrated impedance calibration code N-CODE[0 . . . N], and the third calibrated impedance calibration code C-CODE[0 . . . N].

Figure 5A:
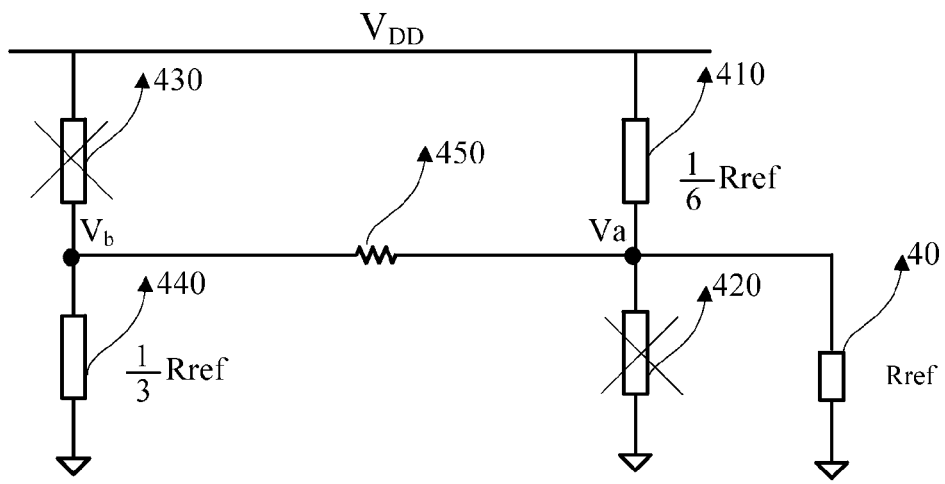
FIG. 5A is a schematic view of equivalent circuit of the impedance calibrated drive circuit of differential structure in FIG. 5.

In another embodiment of the impedance calibration as shown in FIG. 5A, when conducting impedance calibration, the parallel-connected PMOS tubes 410 of the first group and the parallel-connected NMOS tubes 440 of the fourth group are turned partially on, with the parallel NMOS tubes 420 of the second group and the parallel PMOS tubes 430 of the third group being turned off. For an example, the impedance of the parallel-connected PMOS tubes 410 of the first group is configured to be ⅙ Rref, and the parallel-connected NMOS tubes 440 of the fourth group is configured to be ⅓ Rref when the first reference voltage is configured to ¾ times of the supply voltage, and the second reference voltage configured to ¼ times of the supply voltage. The impedance of the parallel MOS tubes 450 of the fifth group will be determined to ⅔ times of the standard impedance 40 when the calibration of the parallel MOS tubes 450 of the fifth group is finished. That is to say, the third code processing module 10''' outputs impedance calibration code C-CODE[0 . . . N] corresponding to impedance of ⅔ Rref.

Figure 5B:
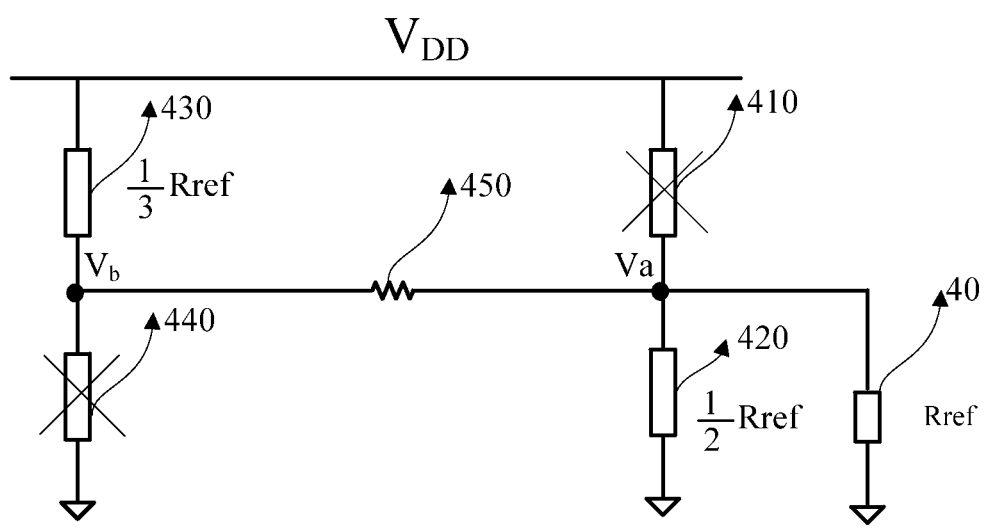
FIG. 5B is a schematic view of equivalent circuit of the impedance calibrated drive circuit of differential structure in FIG. 5.

In another embodiment of the impedance calibration as shown in FIG. 5B, when conducting impedance calibration, the parallel-connected PMOS tubes 430 of the third group and the parallel-connected NMOS tubes 420 of the second group are turned partially on, the parallel-connected NMOS tubes 410 of the first group and the parallel-connected NMOS tubes 440 of the fourth group are turned off. For an example, the impedance of the parallel-connected PMOS tubes 430 of the third group is configured to be ⅓ Rref, and the parallel-connected NMOS tubes 420 of the second group is configured to be ½ Rref when the second reference voltage is configured to ¾ times of the supply voltage, and the first reference voltage configured to ¼ times of the supply voltage. The impedance of the parallel MOS tubes 450 of the fifth group will be determined to ⅔ times of the standard impedance 40 when the calibration of the parallel MOS tubes 450 of the fifth group is finished. That is to say, the third code processing module 10''' outputs impedance calibration code C-CODE[0 . . . N] corresponding to the impedance of ⅔ Rref.

The present invention has a simple structure, can be adapted to both the single-ended signal output and differential signal output at the same time, and can be adapted to wide range of power supply voltage.

The objectives, technical solutions, and beneficial effects of the present invention have been described in further detail through the above specific embodiments. It should be understood that the above descriptions are merely specific embodiments of the present invention, but not intended to limit the protection scope of the present invention. Obviously, the present invention may have many modification, equivalent replacement, or improvement without departing from the spirit or scope of the present invention. Any modification, equivalent replacement, or improvement made without departing from the spirit and principle of the present invention should fall within the scope of the present invention.

What is claimed is:

1. An integrated circuit chip comprising:
at least one driver circuit and a first driver circuit, wherein the at least one driver circuit and the first driver circuit have a same structure and comprise a structure formed by a plurality of parallel-connected PMOS transistors and a plurality of parallel-connected NMOS transistors and at least one node, wherein the at least one driver circuit and the first driver circuit are of differential structure, wherein the first driver circuit comprises parallel-connected PMOS transistors of a first group, parallel-connected NMOS transistors of a second group, parallel-connected PMOS transistors of a third group, parallel-connected NMOS transistors of a fourth group and parallel-connected MOS transistors of a fifth group; and
at least one comparator and at least one code processing module,
wherein the at least one comparator is respectively coupled to the at least one node of the first driver circuit, wherein the at least one node of the first driver circuit comprises a first node and a second node,
wherein the parallel-connected PMOS transistors of the first group and the parallel-connected PMOS transistors of the third group have the same structure, the parallel-connected NMOS transistors of the second group and the parallel-connected NMOS transistors of the fourth group have the same structure, the parallel-connected PMOS transistors of the first group and the parallel-connected NMOS transistors of the second group are connected in series at the first node, the parallel-connected PMOS transistors of the third group and the parallel-connected NMOS transistors of the fourth group are connected in series at the second node, the first node and the second node are connected by the parallel-connected MOS transistors of the fifth group, the first node and the second node provide a differential signal output,
wherein the at least one comparator comprises a first comparator and a second comparator,
wherein the at least one code processing module comprises a first code processing module, a second code processing module, and a third code processing module,
wherein when the chip is conducting impedance calibration under the control of the code processing module, the parallel-connected NMOS transistors of the second group, the parallel-connected PMOS transistors of the third group, the parallel-connected NMOS transistors of the fourth group and the parallel-connected MOS transistors of the fifth group are turned off, a standard impedance is connected to the first node, the parallel-connected PMOS transistors of the first group are turned on, the first comparator compares the value of the first node with that of a first reference voltage, and outputs the first comparison signal, the first code processing module outputs a first impedance calibration code according to the first comparison signal, so as to turn the plurality of parallel-connected PMOS transistors of the first group on and off, respectively;
the parallel-connected PMOS transistors of the first group remaining turned on and off, respectively, the parallel-connected NMOS transistors of the second group are turned on, the first comparator compares the current value of the first node with the value of a second reference voltage and outputs a second comparison signal, the second code processing module outputs a second impedance calibration code according to the second comparison signal, so as to turn the plurality of parallel-connected NMOS transistors of the second group on and off, respectively;
the parallel-connected PMOS transistor of the third group are turned on and off, respectively, by copying the impedance calibration code of the parallel-connected PMOS transistors of the first group, the parallel-connected NMOS transistors of the fourth group are turned on and off, respectively, by copying the impedance calibration code of the parallel-connected NMOS transistor of the second group;
the parallel-connected PMOS transistors of the first group remaining turned on and off, respectively, and parallel-connected NMOS of the fourth group turned on and off, respectively, and with the parallel-connected NMOS transistors of the second group, the parallel-connected PMOS transistors of the third group turned off, the second comparator compares the current value of the second node with the value of a third reference voltage and outputs a third comparison signal, the third code processing module outputs a third impedance calibration code according to the third comparison signal, so as to turn the plurality of parallel-connected MOS transistors of the fifth group on and off, respectively; and
the third code processing module is used to output the third impedance calibration code, so as to turn the parallel-connected MOS transistors of the fifth group on and off, respectively, and
wherein the chip controls the plurality of parallel-connected PMOS transistors and the plurality of parallel-connected NMOS transistors of the at least one driver circuit of differential structure according to the first impedance calibration code, the second impedance calibration code, and the third impedance calibration code.

2. The integrated circuit chip according to claim 1, wherein the first reference voltage is configured to ¾ times of a supply voltage $V_{DD}$, and the second reference voltage is configured to ¼ times of a supply voltage $V_{DD}$.

3. A method of impedance calibrating an integrated circuit chip wherein the integrated circuit chip comprises at least one driver circuit and a first driver circuit, wherein the at least one driver circuit and the first driver circuit have a same structure and comprise a structure formed by a plurality of parallel-connected PMOS transistors and a plurality of parallel-connected NMOS transistors and at least one node, and the chip further comprises at least one comparator and at least one code processing module, wherein the at least one comparator comprises a first comparator and a second comparator, wherein the at least one driver circuit and the first driver circuit are of differential structure, wherein the at least one comparator is respectively coupled to the at least one node of the first driver circuit, wherein the first driver circuit comprises parallel-connected PMOS transistors of a first group, parallel-connected NMOS transistors of a second group, parallel-connected PMOS transistors of a third group, parallel-connected NMOS transistors of a fourth group and parallel-connected MOS transistors of a fifth group, the parallel-connected PMOS transistors of the first group and the parallel-connected PMOS transistors of the third group have the same structure, the parallel-connected NMOS transistors of the second group and the parallel-connected NMOS transistors of the fourth group have the same structure, said method comprising:

connecting a standard impedance to the at least one node of the first driver circuit when the chip is conducted impedance calibration under the control of the at least one code processing module, wherein the at least one node comprises a first node and a second node;

when conducting impedance calibration, turning off the parallel-connected NMOS transistors of the second group, the parallel-connected PMOS transistors of the third group, the parallel-connected NMOS transistors of the fourth group and the parallel-connected MOS transistors of the fifth group, connecting a standard impedance to the first node, turning on the parallel-connected PMOS transistors of the first group, comparing, by the first comparator, the value of the first node with that of a first reference voltage, outputting, by the first comparator, a first comparison signal, and outputting, by the at least one code processing module, a first impedance calibration code according to the first comparison signal, so as to turn the parallel-connected PMOS transistors of the first group on and off, respectively;

with the parallel-connected PMOS transistors of the first group remaining turned on and off, respectively, turning on the parallel-connected PMOS transistors of the second group, comparing, by the second comparator, the value of the second node with that of a second reference voltage, outputting, by the second comparator, a second comparison signal, outputting, by the at least one code processing module, a second impedance calibration code according to the second comparison signal, so as to turn the parallel-connected PMOS transistors of the fourth group on and off, respectively;

turning on and off the parallel-connected PMOS transistors of the third group, respectively, by copying the impedance calibration code of the parallel-connected PMOS transistors of the first group, turning on and off the parallel-connected NMOS transistors of the fourth group, respectively, by copying the impedance calibration code of the parallel-connected NMOS tube transistors of the second group;

with the parallel-connected PMOS transistors of the first group remaining turned on and off, respectively, and parallel-connected NMOS of the fourth group turned on and off, respectively, and with the parallel-connected NMOS transistors of the second group, the parallel-connected PMOS transistors of the third group turned off, comparing the current value of the second node with the value of a third reference voltage, outputting a third comparison signal, and outputting a third impedance calibration code according to the third comparison signal, so as to turn the plurality of parallel-connected MOS transistors of the fifth group on and off, respectively; and controlling the plurality of parallel-connected PMOS transistors and the plurality of parallel-connected NMOS transistors of the at least one driver circuit of differential structure according to the first impedance calibration code, the second impedance calibration code, and the third impedance calibration code that have been calibrated.

4. The integrated circuit chip according to claim 3, wherein the first reference voltage is configured to ¾ times of a supply voltage $V_{DD}$, and the second reference voltage is configured to ¼ times of a supply voltage $V_{DD}$.

* * * * *